United States Patent
McHugh et al.

(10) Patent No.: US 6,561,825 B1
(45) Date of Patent: May 13, 2003

(54) VACUUM PICK UP CAP FOR USE WITH ELECTRICAL CONNECTOR

(75) Inventors: Robert G. McHugh, Golden, CO (US); Sung-Pei Hou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/071,550

(22) Filed: Feb. 8, 2002

(51) Int. Cl.[7] .............................................. H01R 13/44
(52) U.S. Cl. ...................................... 439/135; 439/940
(58) Field of Search ................................ 439/135, 342, 439/476.1, 940, 41

(56) References Cited

U.S. PATENT DOCUMENTS 5,746,611 A * 5/1998 Brown et al. ............... 439/135
5,879,169 A * 3/1999 Wu ............................. 439/74
6,146,155 A * 11/2000 Boling et al. ................ 439/79
6,155,848 A * 12/2000 Lin ............................ 439/135
6,478,588 B1 * 11/2002 Howell et al. .............. 439/135

* cited by examiner

Primary Examiner—Hien Vu
(74) Attorney, Agent, or Firm—Wei Te Chung

(57) ABSTRACT

A vacuum pick up cap (10) for use with an electrical connector (20) includes a body portion (12) to be sucked by a vacuum suction nozzle and a number of legs (13) retained to the electrical connector. The body portion has an upper and a lower faces (120), (121) each having a central recess (122), and a number of peripheral recesses (123) surrounding the central recess, the recesses being spaced from each other. The body portion is substantially reduced in thickness due to the presence of the recesses.

5 Claims, 6 Drawing Sheets

VACUUM PICK UP CAP FOR USE WITH ELECTRICAL CONNECTOR

BACKGROUND OF THE INVENTION

1. Field of the Invention

The present invention relates to the art of electrical connectors, and particularly to a vacuum pick up cap for use with an electrical connector.

2. Description of the Related Art

Electronic components, for example electrical connectors, often require manipulation for properly positioning on electronic apparatus, such as a printed circuit board, by means of a vacuum suction nozzle. The vacuum suction nozzle picks up the electrical connector typically with the aid of a vacuum pick up cap which has a body portion to be sucked by the vacuum suction nozzle and a retention mechanism retaining the body portion to the electrical connector. The copending application Ser. No. 09/909,584 and another application titled "PICK-UP CAP FOR A CPU SOCKET" filed Jan. 28, 2002 with an unknown serial number, of which both have the same assignee with the invention, disclose the pick up cap is latched to the socket when the cover of the socket is moved from the first position to a second position.

Dilemma often exists in design when the thickness of the body portion is concerned, because the thinner the body portion is, the easier the body portion is sucked by the vacuum suction nozzle, while the worse the rigidity thereof is and the more difficult it is manufactured.

Therefore, an improved vacuum pick up cap for use with an electrical connector is desired to resolve the above-mentioned problems.

SUMMARY OF THE INVENTION

An object of the present invention is to provide a vacuum pick up cap, which facilitates vacuum suction without affecting the rigidity thereof.

A vacuum pick up cap in accordance with the present invention comprises a body portion and a plurality of legs extending from the body portion and retained to the electrical connector. The body portion has upper and lower faces. Each face defines a central recess and four peripheral recesses surrounding the central recess. The recesses are recessed from the upper and the lower faces and substantially reduce the thickness of the body portion.

Other objects, advantages and novel features of the invention will become more apparent from the following detailed description of the present embodiment when taken in conjunction with the accompanying drawings.

DETAILED DESCRIPTION OF THE INVENTION

Figure 1:
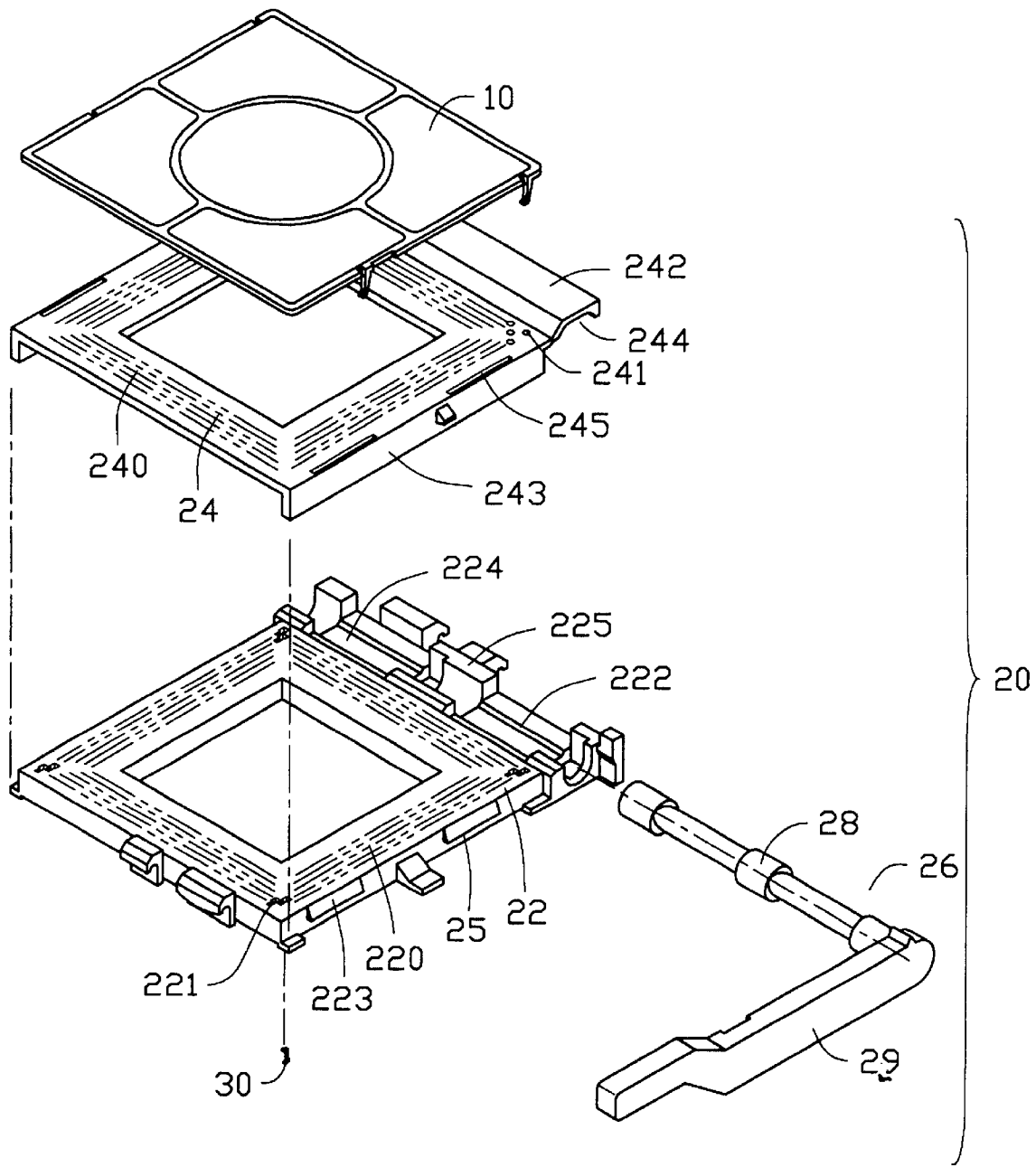
FIG. 1 is an exploded perspective view of a vacuum pick up cap in accordance with the present invention and an electrical connector.
Figure 2:
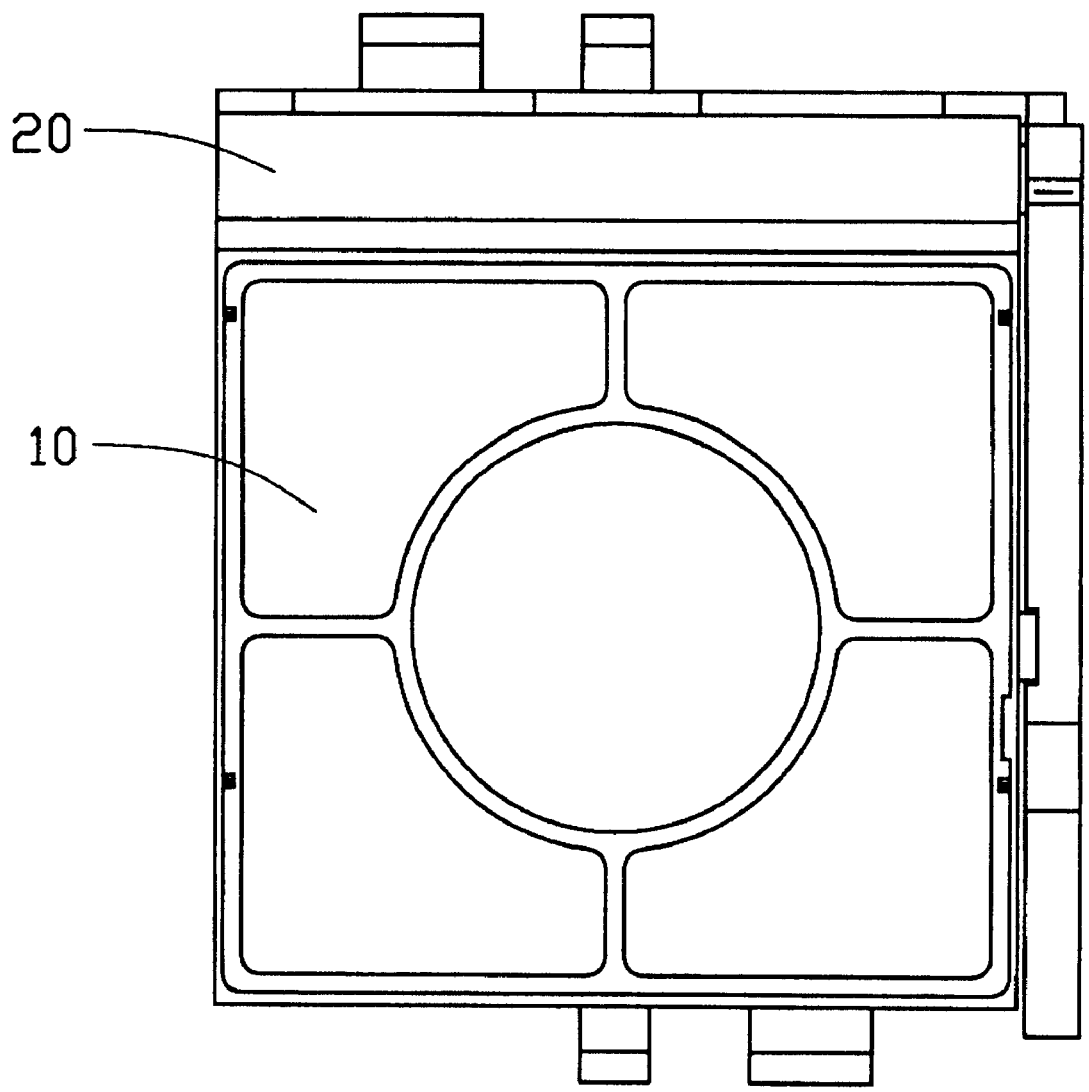
FIG. 2 is an assembled top plan view of FIG. 1.
Figure 3:
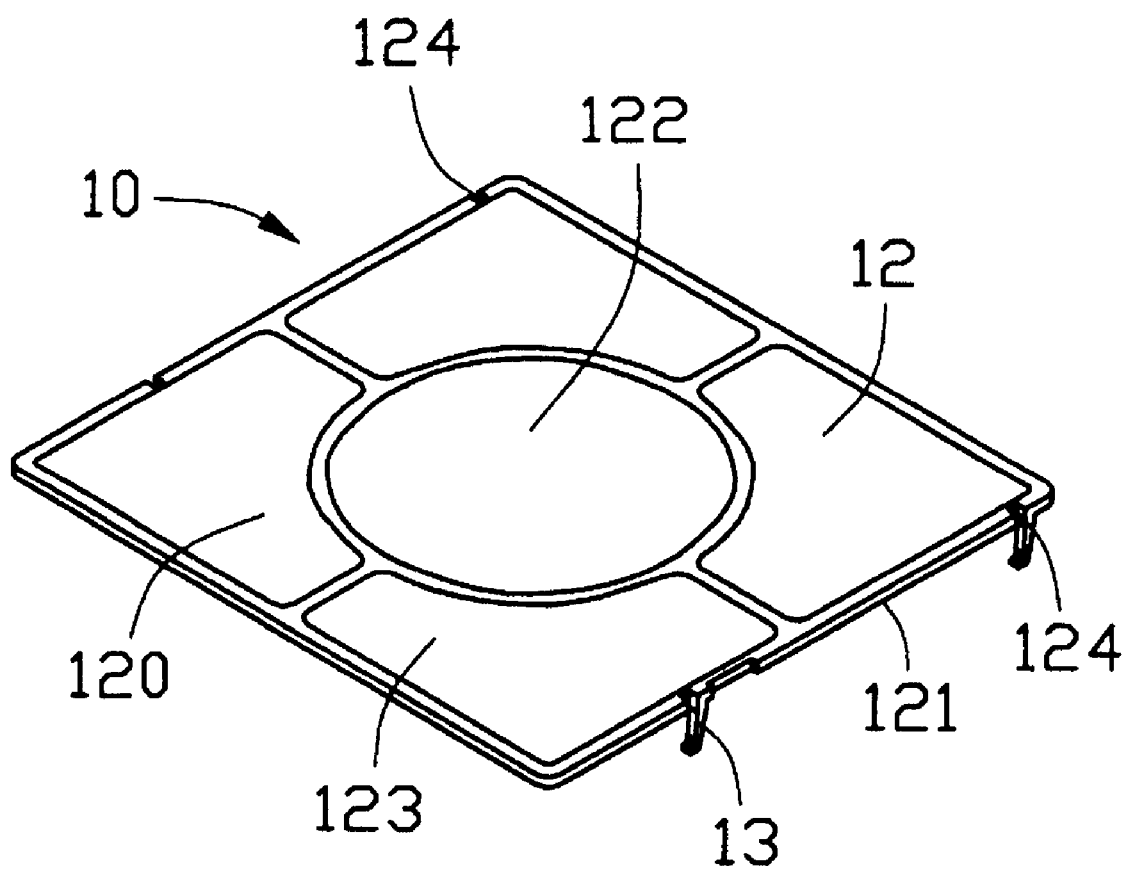
FIG. 3 is a perspective of the vacuum pick up cap of FIG. 1.
Figure 4:
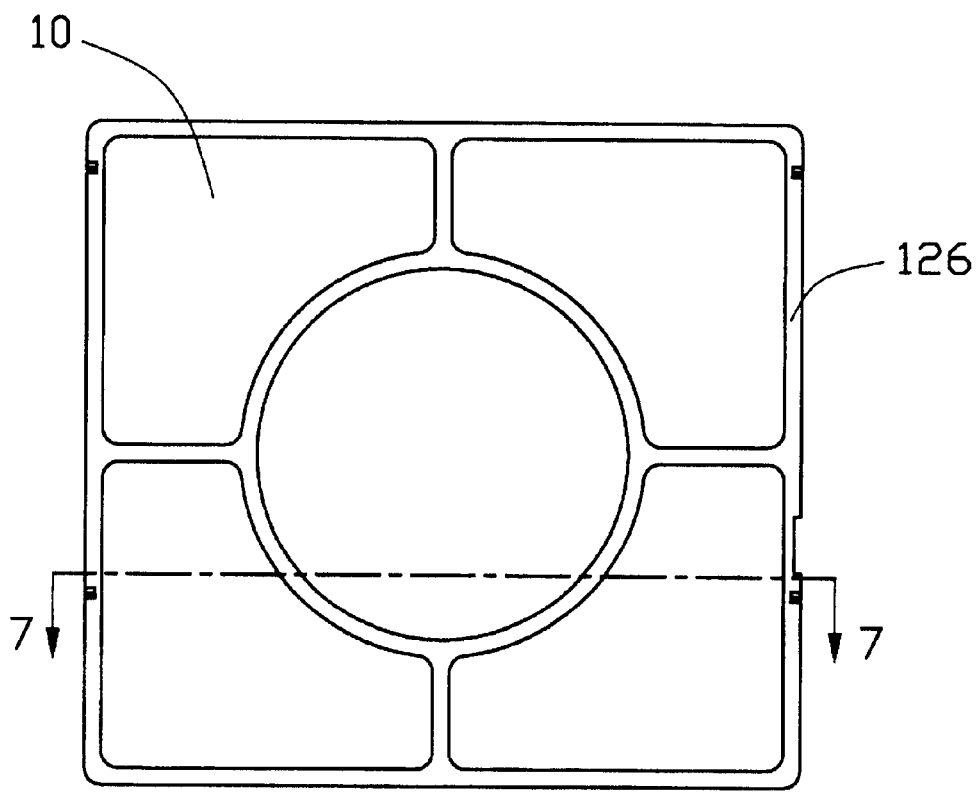
FIG. 4 is a top plan view of the vacuum pickup cap of FIG. 3.
Figure 5:
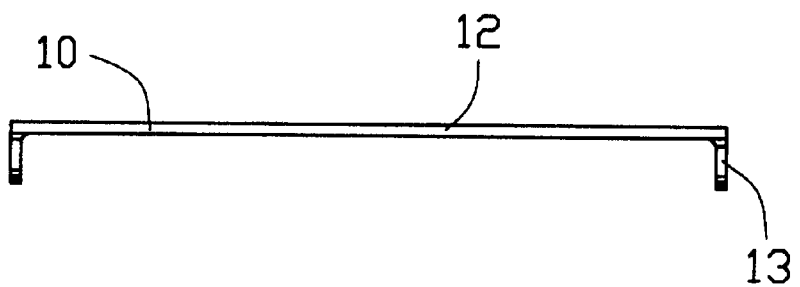
FIG. 5 is a front view of the vacuum pick up cap of FIG. 3.
Figure 6:
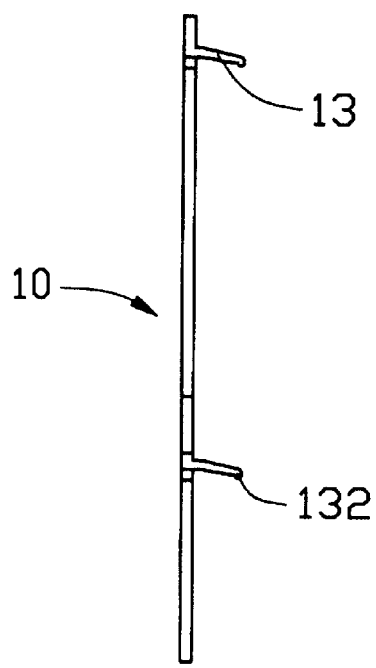
FIG. 6 is a side elevational view of the vacuum pick up cap of FIG. 3.
Figure 7:
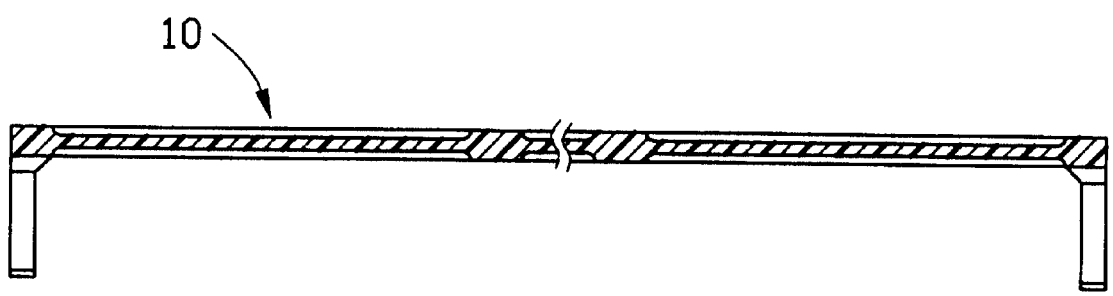
FIG. 7 is a cross-sectional view taken along line 7—7 of FIG. 4.

Referring to FIGS. 1 and 2, a vacuum pick up cap 10 in accordance with the present invention for use with an electrical connector 20 is shown. Also referring to FIGS. 3–7, the vacuum pick up cap 10 comprises a body portion 12 and two pairs of legs 13.

The body portion 12 is generally rectangular and has an upper face 120 and a lower face 121 opposite to the upper face 120. Each of the upper and the lower faces 120, 121 defines a circular central recess 122 in a central section thereof and a peripheral recess 123 in each of four corners thereof. The central recess 122 is surrounded by the peripheral recesses 123 and is separated from the peripheral recesses 123. The peripheral recesses 123 on each of the upper and the lower faces 120, 121 are respectively separated from each other. The body portion 12 has two opposite sides 126 each defining a pair of spaced cutouts 124.

The legs 13 extend downwardly from the sides 126 of the body portion 12. Each leg 13 is adjacent to one cutout 124 at an upper end thereof and forms a hook section 132 at a lower end thereof.

Figure 8:
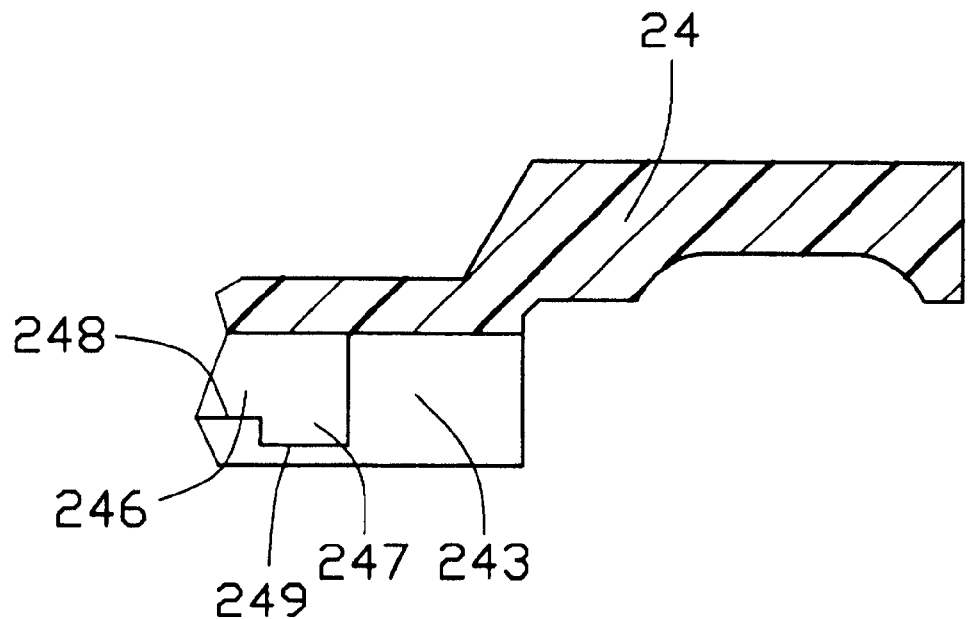
FIG. 8 is a cross-sectional view of a part of a cover of the electrical connector of FIG. 1.

Also referring to FIGS. 1 and 8, the electrical connector 20 illustrated is a Zero Insertion Force (ZIF) socket connector, comprising a base 22, a cover 24, an actuator 26 and a plurality of conductive contacts 30. The base 22 is generally rectangular in shape and includes a rectangular base frame 220 and an actuator accommodating portion 222 on one side of the base frame 220. The base frame 220 is formed with a plurality of openings 221 for receiving and retaining the conductive contacts 30 therein and a pair of protrusions 223 formed on each of opposite side surfaces of the base 22. The actuator accommodating portion 222 defines a slot 224 and forms a plurality of blocks 225 adjacent the slot 224.

The cover 24 is movably mounted to the base 22 and has a rectangular cover frame 240 and an actuator accommodating portion 242 on one side of the cover frame 240. The cover frame 240 and the actuator accommodating portion 242 substantially correspond to and align with the base frame 220 and the actuator accommodating portion 222 of the base 22, respectively. The cover frame 240 defines a plurality of holes 241 corresponding to the openings 221 of the base 22. Two pair of flanges 243 extend downwardly from opposite edges of the cover frame 240. Two pair of slits 245 is defined in the cover frame 240 alongside the flanges 243. Each flange 243 defines in an inner surface thereof an elongated cavity 246 extending along the flange 243 and formed correlatively with the corresponding slits 245 via an injection molding process for slidably receiving the protrusions 223 of the base 22 and a pair of channels 247 communicating with the cavity 246 and extending deeper than the cavity 246 such that bottoms 249 thereof are located below a bottom 248 of the cavity 246. The cavities 246 and the channels 247 are arranged in such a way that when the cover 24 is movably assembled to the base 22, the protrusions 223 extend into the cavities 246 with bottoms 25 of the protrusions 223 being partly supported by the bottoms 248 of the cavities 246 for fastening the cover 24 and the base 22 together in a vertical direction, and partly extending into the channels 247 and spaced from the bottoms 249 of the channels 247. The actuator accommodating portion 242 defines a groove 244 in a lower surface thereof to cooperate with the slot 224 to define a channel therebetween.

The actuator 26 comprises a lever 28 received within the channel formed by the slot 224 and the groove 244 and a handle 29 extending from an end of the lever 28. The actuator 26 could be in any other forms, as is known to one of ordinary skill in the pertinent art, used in all kinds of ZIF socket connectors, for example a cam extending in holes of the base and the cover, on the only condition that it can be manipulated to move the cover with respect to the base in use.

Figure 9:
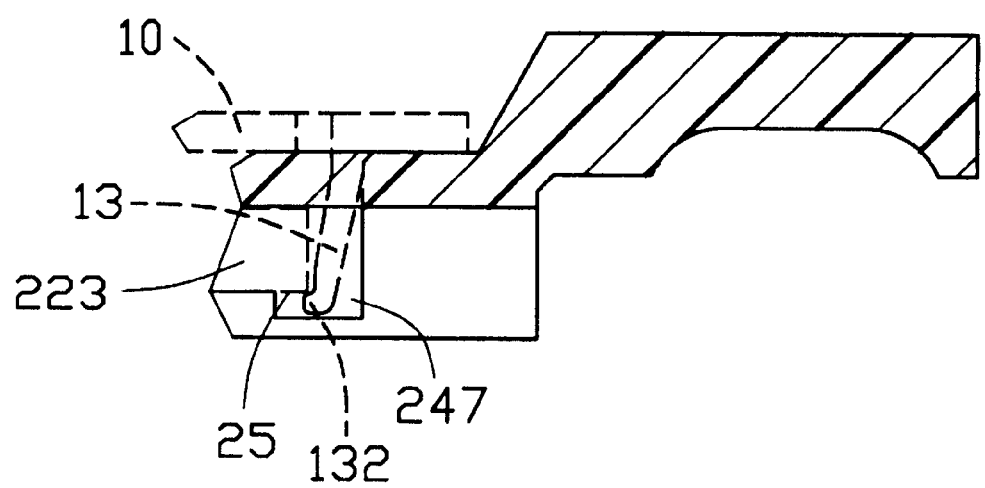
FIG. 9 is similar to FIG. 8 but showing the vacuum pick up cap attached to the electrical connector.

Also referring to FIG. 9, when the electrical connector 20 is to be picked up by the vacuum suction nozzle by means of the vacuum pick up cap 10, the legs 13 of the vacuum pick up cap 10 extend through the slits 245 into the channels 247 with the hook portions 132 engaging the bottoms 25 of the protrusions 223 to be retained thereto. The body portion 12 covers the cover frame 240 of the cover 24 and is then sucked by the vacuum suction nozzle at the central recess 122 of the upper surface 120 thereof.

As is clearly seen from the drawings, the central and the peripheral recesses 122, 123 occupy a major portion of the surface area of the body portion 12, preferably greater than 50% of the surface area, whereby the thickness of the body portion 12 is substantially reduced while the structural strength is maintained.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical assembly to be picked up by a vacuum suction nozzle, comprising:
    an electrical connector comprising:
        a base defining a plurality of openings;
        a plurality of conductive contacts being received and retained in the openings of the base;
        a cover being movably mounted to the base and defining a plurality of holes corresponding to the openings of the base; and
        an actuator being mounted to the base and the cover for driving the cover with respect to the base; and
    a vacuum pick up cap comprising a body portion adapted to be sucked by a vacuum suction nozzle, and a plurality of legs extending from the body portion, the legs engaging the base and the cover; wherein
    the cover defines a plurality of slits for extension of the legs, a pair of flanges extending from the cover and each defining a plurality of channels communicating with the slits to receive the legs, and the base forming a plurality of protrusions extending into the channels to engage and retain the legs; wherein
        each flange of the cover defines a cavity communicating with the channel and each defining a first bottom supporting the protrusion of the base, and each channel having a second bottom below the first bottom of the cavity for partially accommodating the corresponding leg; wherein
            each leg comprises a hook section extending below the first bottom of the cavity and engaging the protrusion to retain the vacuum pick up cap on the electrical connector.

2. The electrical assembly as claimed in claim 1, wherein the body portion of the vacuum pick up cap has a surface defining a plurality of recesses therein, the recesses together occupying more than 50 percent of the surface of the body portion.

3. The electrical assembly as claimed in claim 1, wherein said legs are located substantially at two opposite side edges of said connector.

4. An electrical assembly comprising:
    a socket including a base and a cover which is seated upon the base and moveable relative to the base in a front-to-back direction;
    the base defining a plurality of openings;
    a plurality of contacts received within the corresponding openings, respectively;
    the cover defining a plurality of through holes in vertical alignment with the corresponding openings, respectively;
    at least one protrusion formed on at least one side face of the base;
    at least one slit formed in the cover generally in vertical alignment with said at least one protrusion and forming at least one cavity thereunder, said at least one protrusion received in said at least one cavity to vertically fasten the cover and the base together;
    a pick-up cap including a body portion with at least one leg thereof; wherein said leg extends downwardly into said least one slit substantially in a free manner when said cover is in a first position relative to the base, and successively is latchably engaged with at least one of said base and said cover when said cover is moved from the first position to a second position along said front-to-back direction.

5. The assembly as claimed in claim 4, wherein said leg is latched to said at least one protrusion when said cover is in the second position.

* * * * *